United States Patent
Williams et al.

(10) Patent No.: US 6,589,879 B2
(45) Date of Patent: Jul. 8, 2003

(54) NITRIDE OPEN ETCH PROCESS BASED ON TRIFLUOROMETHANE AND SULFUR HEXAFLUORIDE

(75) Inventors: Scott M. Williams, Sunnyvale, CA (US); Wei Liu, Sunnyvale, CA (US); David Mui, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/766,187

(22) Filed: Jan. 18, 2001

(65) Prior Publication Data
US 2002/0132486 A1 Sep. 19, 2002

(51) Int. Cl.[7] .............................................. H01L 21/302
(52) U.S. Cl. ........................ 438/714; 438/719; 438/723; 438/724
(58) Field of Search ................................. 438/424–426, 438/692, 701, 700, 706–714, 719, 723–724

(56) References Cited

U.S. PATENT DOCUMENTS

| | | | |
|---|---|---|---|
| 4,693,781 A | 9/1987 | Leung et al. ............... 156/643 |
| 4,729,815 A | 3/1988 | Leung ........................ 156/643 |
| 4,857,477 A | 8/1989 | Kanamori .................... 437/47 |
| 5,753,044 A | 5/1998 | Hanawa et al. ........... 118/723 I |
| 5,843,846 A | 12/1998 | Nguyen et al. .............. 438/713 |
| 5,968,842 A | * 10/1999 | Hsiao .......................... 438/692 |
| 5,968,847 A | 10/1999 | Ye et al. ...................... 438/734 |
| 6,001,706 A | * 12/1999 | Tan et al. ..................... 438/424 |
| 6,090,697 A | * 7/2000 | Xing et al. .................. 438/618 |
| 6,103,635 A | 8/2000 | Chau et al. .................. 438/739 |
| 6,153,494 A | * 11/2000 | Hsieh et al. ................. 438/424 |
| 6,165,850 A | * 12/2000 | Wu .............................. 438/275 |
| 6,177,351 B1 | * 1/2001 | Beratan et al. .............. 438/694 |
| 6,235,643 B1 | * 5/2001 | Mui et al. .................... 438/719 |
| 6,335,293 B1 | * 1/2002 | Luo et al. .................... 438/710 |

* cited by examiner

*Primary Examiner*—Benjamin L. Utech
*Assistant Examiner*—Duy-Vu Deo
(74) *Attorney, Agent, or Firm*—Charles S. Guenzer; Joseph Bach

(57) ABSTRACT

A nitride etch process particularly useful when integrated with a silicon trench etch needing a sloping silicon surface adjacent to the interface between the silicon and an oxide layer intermediate the silicon and nitride. The nitride etch process is a plasma process having an etching gas mixture of sulfur hexafluoride ($SF_6$) and trifluoromethane ($CHF_3$) although nitrogen or oxygen may be added for additional controls. The trifluoromethane is believed to create a polymer passivation on the sidewalls of the hole being etched which, when the etch reaches the oxide-silicon interface, protects the interface and underlying silicon. The nitride etch may proceed through the oxide or a separate fluorocarbon-based oxide etching step may be performed before a bromine-based etch of the silicon starts.

29 Claims, 3 Drawing Sheets

NITRIDE OPEN ETCH PROCESS BASED ON TRIFLUOROMETHANE AND SULFUR HEXAFLUORIDE

FIELD OF THE INVENTION

The invention relates generally to etching of materials. In particular, the invention relates to the plasma etching of both silicon nitride and silicon oxide.

BACKGROUND ART

The continuing level of integration in semiconductor integrated circuits has in large part been accomplished by the reduction in minimum feature size, often referred to as critical dimension (CD) with respect to a particular type of feature. Integrated circuits are now entering production based on a CD of 0.18 μm. Further and significant decreases in CD are being planned.

The reduction in CD has been obtained not only by finer photolithography but also by more sophisticated processing. In etching features into an already formed partial structure, the etching is almost always done with dry plasma etching, and the dry etching process has been made to overcome problems introduced by the small feature sizes. In particular, the directionality of etching narrow holes in already formed features must be controlled for a variety of requirements. Typically, the holes should have a nearly vertical profile, but, in some cases, special etching profiles must be obtained.

An example of a special profile is a shallow trench isolation (STI), formed from the partially developed structure illustrated in the cross-sectional views of FIGS. 1 and 2. STI is intended to electrically isolate neighboring semiconductor transistors on the semiconductor chip. The more final structure is illustrated in FIG. 2. The vertical structure before lateral definition, illustrated in FIG. 1, includes a silicon substrate 10, a pad oxide layer 12 of about 15 nm thickness, a silicon nitride ($Si_3N_4$) layer 14 of about 150 nm thickness to act as a hard mask, and an anti-reflective coating (ARC) layer 16 of about 70 nm thickness and typically composed of silica although other compositions are used. The silicon substrate 10 is semiconducting, and active devices such as transistors are intended to be formed in it after the trench isolation. The pad oxide layer 12 provides adhesion to the silicon substrate 10 in view of the relatively poor adhesion of silicon nitride to silicon, and it further protects the underlying silicon during nitride removal. Oxide is the common descriptor for silicon oxide, usually having a composition close to silicon dioxide, often referred to as silica, but minor components of other elements may also be present. Nitride is a somewhat generic term for a material having a composition $SiN_x$, where x may have values between about 1 and 1.5. The ARC layer 16 facilitates the subsequent photographic definition of the features. A photoresist layer 18 of about 400 nm thickness is deposited and defined into horizontally extending ridges 20. The ridge width is often the critical dimension.

A series of etch steps are then used to produce the structure illustrated in the cross-sectional view of FIG. 2 in which a trench 22 is etched deeply into the silicon substrate 10 between the two ridges defined by the patterned photoresist layer 18. An exemplary trench depth in the silicon is 350 to 500 nm. The etching of the ARC layer 16 is standard and will not be further discussed.

The nitride hard mask 14 is required because such a deep trench etch tends to etch the side of the photoresist 18 of FIG. 1, thus comprising the critical dimension. The nitride hard mask 14 is more resistant to such side etching. Nonetheless, it is desired that the photoresist 18 remain through the trench etch since its presence or absence substantially affects the overall etching chemistry. Thereafter, in steps not intimately connected with the invention, the photoresist 18 is removed, and oxide dielectric is filled into the trench 22 and over it. Several steps including chemical mechanical polishing remove the nitride layer 14 and oxide layer 12 and level the oxide dielectric at the top of the trench. The silicon ridges are thereby exposed between oxide-filled trenches, and transistor gates are formed on the exposed silicon. The oxide dielectric in the trenches 22 provides electrical isolation between the semiconductor devices formed in neighboring ridges.

As shown, it is desirable to etch the various layers in such a way as to form soft shoulders 24 at the top corner 26 of the trench 22. It has been observed that the top corners 26 formed between the silicon and the patterned oxide layer 12 critically affect the performance and reliability of the semiconductor devices formed in the adjacent top silicon surface. The degree of the shoulder shaping can be adjusted for different designs. The illustrated shaping represents one extreme. Other designs produce a more moderate, concave shape, rather than the illustrated convex shape, but a shape having a finite inward and downward slope away from the vertical.

Plasma chemistries for etching silicon with the desired profiles are well known. One type of recipe is based on hydrogen bromide (HBr), oxygen gas ($O_2$), and chlorine gas ($Cl_2$). However, the trench shoulder is in large part determined by the nitride open etch process piercing the nitride layer 14 because the nitride open etch tends to be relatively unselective to the underlying silicon, with selectivities of etching nitride relative to silicon of less than unity being typically observed, and an extensive over etch is required to guarantee that the nitride has been opened. That is, the nitride open process inevitably etches somewhat into the silicon, and this initial silicon etching significantly influences the shape of the shoulder 24 adjacent the oxide-silicon corner 26.

At the present time, there are two popular recipes for the nitride open, neither of which produces the desired shoulder 24. A first recipe uses a single step for plasma etching both the nitride hard mask 14 and the underlying oxide layer 12 based on the etching gas combination $SF_6$/HBr with strong wafer biasing during etching. This chemistry and strong biasing produce an anisotropic etch of the nitride and oxide, as illustrated in the cross-sectional view of FIG. 3. However, it produces a generally isotropic etch of silicon. As a result, upon breakthrough of the nitride/oxide layer, an incipient trench 30 is formed having retrograde sidewalls 32 underlying the oxide layer 12 and having an acute corner 34 between the silicon and oxide. A second recipe is broken into two steps. The first step uses the $SF_6$/HBr etching gas only part way through the oxide layer 12. Then, to produce the structure illustrated in the cross-sectional view of FIG. 4, a $CF_4$/Ar plasma etching gas is used with substantial wafer biasing to produce a strongly isotropic etch resulting in an incipient trench 36 having a vertical profile. The exposed oxide-silicon corner 38 is approximately vertical and flat and is exposed during the subsequent silicon etching. For some applications, it is desired to form nearly vertical trench sidewalls in the silicon layer 10, but they should not extend up to the oxide layer 12. In other applications, trench tapering is desired to facilitate oxide backfilling. However, with decreasing spacing between features, the taper angle must be raised closer to the 90° vertical profile.

We have tried adding $CF_4$ to the $SF_6$/HBr etching gas. The nitride etch rate and CD control are improved, but the photoresist selectivity still remains significantly below unity.

Accordingly, a plasma etching process is desired to etch silicon nitride and silicon oxide with enhanced photoresist selectivity and producing a rounded corner between the oxide and underlying silicon.

SUMMARY OF THE INVENTION

The invention includes a nitride plasma etching process using an etching gas mixture principally composed of sulfur hexafluoride ($SF_6$) and a weakly polymerizing hydrofluorocarbon, the preferred example of which is trifluoromethane ($CHF_3$).

The process is preferably performed in a plasma reactor having a decoupled plasma source and an RF biased pedestal electrode supporting the substrate being etched. During the nitride etching process, the bias power is moderate, for example, 200 to 350 W for a 200 mm wafer, and preferably between about a third and a half of the plasma source power.

The nitride etching process is particularly useful when the nitride layer overlies a silicon layer with an oxide layer in between, and the corner of the oxide-silicon interface must be protected, for example, by a sloping upper surface of silicon next to the oxide layer. An example of such a structure is a trench etched in silicon, such as a shallow trench isolation.

In an integrated process of the invention of etching a trench underlying oxide and nitride layers, the nitride etch may be continued until it breaks through the oxide, and thereafter a bromine-based plasma etch process forms the trench. Alternatively, a separate oxide etch step may be used based on fluorine chemistry, particularly using a fluorocarbon such as carbon tetrafluoride. Preferably, the bias power is kept low during the oxide etch.

The integrated process is preferably performed in a single plasma reaction chamber.

DETAILED DESCRIPTION OF THE PREFERRED EMBODIMENTS

The addition of a hydrofluorocarbon, in particular trifluoromethane ($CHF_3$), to a non-carbon fluorine-based nitride etch increases the photoresist selectivity and allows additional control of the nitride profile and the shape of an over etched underlying silicon. Superior results are obtained when the etching gas consists of only sulfur hexafluoride ($SF_6$) and trifluoromethane at moderately high pressures and when the wafer is moderately biased.

Figure 5:
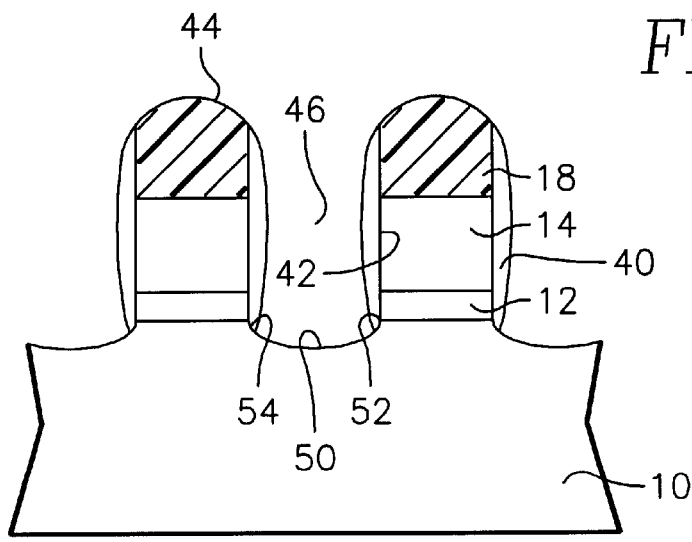
FIG. 5 is a cross-sectional view of a structure, generally corresponding to those of FIGS. 3 and 4, which illustrates the role of the polymer produced by the invention.

Although our invention is not limited by our understanding of its mechanisms, we believe that trifluoromethane or another hydrofluorocarbon provides its beneficial results because it is a weakly polymerizing gas in a fluorine-based chemistry. This effect has been widely used in oxide etching to control selectivity of oxide etching to silicon and silicon nitride and to provide sidewall passivation that produces vertical etch profiles. The carbon based polymer produced by $CHF_3$ is very similar in structure and chemistry to the photoresist, and scanning electron micrographs (SEMs), the primary tool in determining etch rates and profiles, do not easily distinguish the polymer from the photoresist. As illustrated in the cross-sectional view of FIG. 5, a polymer 40 originating from the $CHF_3$ is formed on the nitride sidewall 42 during the etching. The polymer 40 smoothly joins with the photoresist layer 18 as it is being etched. The photoresist 18 is preferentially etched at the photoresist facets 44 adjacent to a developing hole 46 as it is being etched through the nitride 14 and oxide 12. Once the facets 44 extend down to the nitride layer 14, the patterned photoresist 18 no longer controls the CD.

The polymer 40 forms preferentially as the polymeric sidewalls 40 because the $SF_6$/$CHF_3$ plasma etch is being done with substantial wafer biasing, resulting in reactive ion etching (RIE) in which the energetic ions catalyze the etching reaction. However, the geometry does not favor ion bombardment of the sidewalls. Thereby, the polymer forms on the nitride sidewalls 42 and protects them to achieve anisotropic etching and vertical profiles. Further, the polymer tends to form on top of the photoresist 18 and even at the photoresist facets 44. While the nitride etching chemistry does not allow the polymer to accumulate in these exposed geometries, the net photoresist etching rate is reduced. That is, the polymerizing chemistry of the nitride etch increases its selectivity to photoresist even if no significant polymer is observed to form on the exposed surfaces. This is a clean polymerizing chemistry which relies on the polymer but without a significant thickness of it accumulating. On the other hand, a rich polymerizing chemistry would produce thick layers of polymer, even on horizontal surfaces, including chamber walls. Such a rich chemistry is thus dirty and causes problems with particles and maintenance cycles for cleaning.

However, the $SF_6$ plasma etching is performed under conditions of only moderate wafer biasing so that it produces a curved etching front 50 even as it is etching through the nitride 40 and oxide 12. Nonetheless, the curved etching front 50 substantially maintains verticality of the sidewalls.

When the etching front 50 meets a corner 52 between the oxide 12 and the silicon 10, the polymer 40 immediately forms to protect the corner 52 as well as a silicon corner slope 54. That is, a shoulder begins to develop in the silicon. The process for opening the nitride and oxide layers 14, 12 is stopped approximately at the stage illustrated in FIG. 5. Thereafter, the silicon trench etch step starts, and it produces the trench shape illustrated in FIG. 2.

Figure 6:
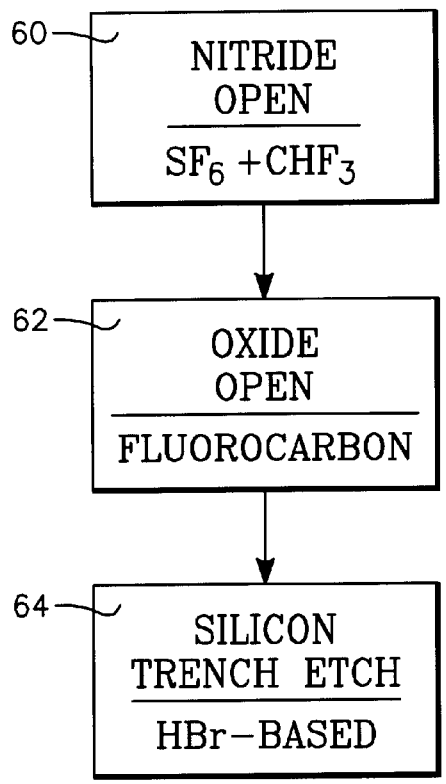
FIG. 6 is a flow diagram of a three-step integrated etch process according to the invention.

A first integrated process for the oxide and nitride opens and the trench etch are illustrated in the flow diagram of FIG. 6. As mentioned previously, the ARC open is conventional and non-crucial, and its details depend upon the choice of the material of the ARC layer 16. Accordingly, it will not be discussed even though it relies on the same photomask as the subsequent steps to be now described.

A nitride open step 60 is performed using the patterned photoresist layer as the photomask. It is a plasma etch process using $SF_6$ and $CHF_3$ as the primary etching gases.

As will be explained later, other additive gases such as $O_2$ and $N_2$ may be added for polymer control and other reasons, but neither HBr nor a diluent gas such as Ar is included within the preferred embodiment of the invention. The nitride open step 60 is preferably monitored by an end point detection system, such as one based on optical emission spectroscopy (OES). In this embodiment, when the OES system detects that no more SiN species are being produced in the plasma, that is, the nitride layer is etched through, the nitride open step 60 is stopped.

Thereafter, a oxide open step 62 is performed using the same patterned photoresist as the photomask. Oxide etching is well developed, and recipes based on fluorocarbons and hydrofluorocarbons are well matched to the geometry required here. In fact, the oxide layer is relatively thin and some photoresist removal can be tolerated. Further, it is desired to somewhat etch the underlying silicon. For these reasons, a highly polymerizing chemistry typical for deep hole etching of inter-level oxide layers is not required or even desired. Instead, a lean fluorocarbon such as carbon tetrafluoride ($CF_4$) is preferred, but richer hydrogen-containing fluorocarbons including trifluoromethane may be alternatively used. The oxide open step 62 may be timed such that it definitely breaks through the oxide and preferably etches somewhat into the underlying silicon. The curved etch front is promoted by a relatively low wafer bias power.

The final etch step, except for photoresist ashing and other cleaning and treatment prior to the oxide refill, is a fairly conventional silicon trench etch step 64 based on known bromine chemistry, typically using hydrogen bromide (HBr) as the main etchant. Depending upon the application and preferred design, other gas components such as $O_2$ and $Cl_2$ may be added and the process parameters varied to affect the trench taper and other effects. It is desired that the photoresist selectivity during the trench etch 64 be high enough that the photoresist remain on top of the nitride during the entire trench etch. Otherwise, the final elimination of the photoresist midway through the trench etch would change the chamber chemistry since the photoresist contributes part of the polymeric content of the chamber, and hence the trench profile is likely to change at that point. The high photoresist selectivities in the nitride and oxide open relax the requirement for photoresist selectivity in the trench etch.

The duration of the trench etch depends on the desired trench depth and is typically timed.

Several integrated recipes has been developed for use on the DPS (decoupled plasma source) Poly Etch reactor, available from Applied Materials of Santa Clara, Calif. Hanawa et al. describe the reactor configuration and its use in U.S. Pat. No. 5,743,044. It is a single-wafer plasma etch reactor having one RF source powering one or more inductive coils wrapped around a curved dielectric dome overlying the wafer and producing a source plasma region. It has a second RF source biasing a pedestal electrode supporting the wafer to create a negative DC self-bias at the wafer, which attracts and accelerates ions from the plasma to the wafer. An advantage of most decoupled plasma sources is that the plasma source power can be varied independently of the wafer biasing power. Further, the DPS chamber is flexible enough to allow an in situ process of the invention in which all the etch steps including the ARC open and cleaning can be performed in the same chamber without breaking vacuum and with minimal contamination between the steps. Performing the post-etch ashing of the photoresist in the same chamber is being developed. The single-chamber operation also reduces the overhead involved in wafer handling and chamber pump down and equilibration.

The inductive coil of the decoupled plasma source may assume other shapes, such as flat, cylindrical, multi-cylindrical, or coned. Also, other types of decoupled plasma sources are available, for example, remote plasma source (RPS) and electron cyclotron resonance (ECR) reactors.

An exemplary recipe for the three-step process of FIG. 6 is summarized in TABLE 1.

TABLE 1

|  | Nitride Open | Oxide Open | Trench Etch |
|---|---|---|---|
| $SF_6$ Flow (sccm) | 10 | | |
| $CHF_3$ Flow (sccm) | 100 | | |
| $CF_4$ Flow (sccm) | | 80 | |
| Ar Flow (sccm) | | 120 | |
| HBr Flow (sccm) | | | 180 |
| $O_2$ Flow (sccm) | | | 8 |
| $Cl_2$ Flow (sccm) | | | 30 |
| Pressure (mTorr) | 30 | 30 | 30 |
| Source Power (W) | 700 | 700 | 1000 |
| Bias Power (W) | 250 | 50 | 225 |
| Cathode Temp. (° C.) | +50 | +50 | +50 |
| Duration (s) | End Pt. | 20 | 60 |

It is seen that the nitride open of this recipe is performed with a relatively high fraction of $CHF_3$ and a moderate bias power, about one-quarter of the source power. The inventive nitride open chemistry improves the photoresist selectivity by 10 to 15% over a standard $SF_6$/HBr recipe and also reduces the CD loss. Further, the verticality of the nitride etch can be controlled to a higher level. The nitride etch rate is somewhat reduced from that available with $SF_6$/HBr, but is still in the vicinity of 150 to 200 nm/min. The chemistry of the oxide open is lean, and the bias power is low so that the etch is not strongly anisotropic.

The powers and flows summarized above apply to a chamber designed for 200 mm wafers. Powers scale approximately with the area of the wafer.

Figure 7:
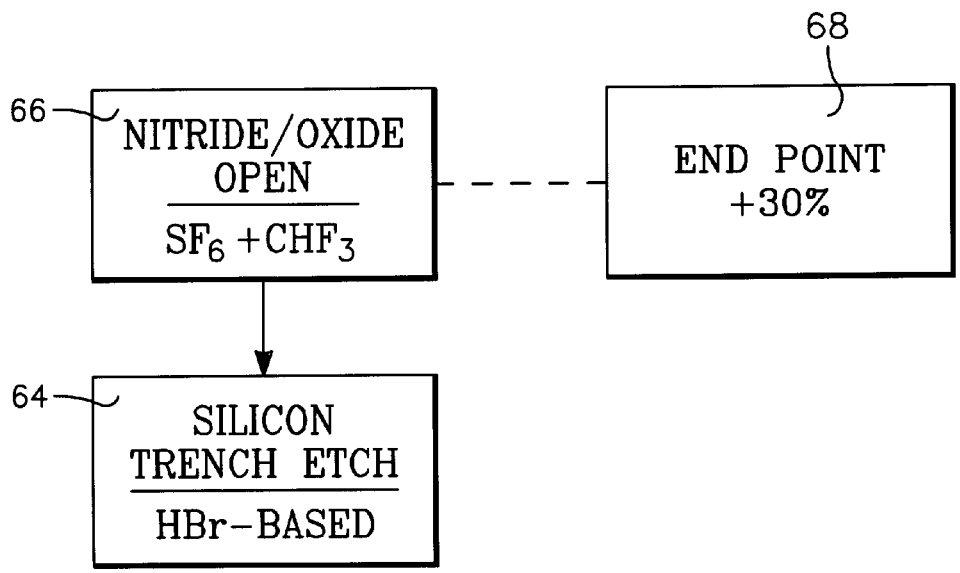
FIG. 7 is a flow diagram of a two-step integrated etch process according to the invention.

A two-step integrated process illustrated in the flow diagram of FIG. 7 combines the nitride and oxide open steps and closely resembles the recipe of TABLE 1 except for the condition of stopping the first step. A first step 66 opens both the nitride and the oxide layers using the same chemistry as for the previously described nitride open. However, a stop condition 68 requires that the nitride/oxide open step 66 be continued not only until the nitride end point is detected but then for an additional 30% of the etch duration until the end point was detected. The 30% over etch allows the nitride recipe to additionally etch through the oxide layer and somewhat into the silicon. The higher bias power of the nitride/oxide open means that the silicon over etch is more anisotropic than the low-bias oxide open of TABLE 1. Thereafter, the previously described silicon trench etch 64 is performed. The two-step process is summarized in TABLE 2.

TABLE 2

|  | Nitride/ Oxide Open | Trench Etch |
|---|---|---|
| $SF_6$ Flow (sccm) | 10 | |
| $CHF_3$ Flow (sccm) | 100 | |
| HBr Flow (sccm) | | 180 |
| $O_2$ Flow (sccm) | | 8 |
| $Cl_2$ Flow (sccm) | | 30 |
| Pressure (mTorr) | 30 | 30 |

TABLE 2-continued

|  | Nitride/<br>Oxide<br>Open | Trench<br>Etch |
|---|---|---|
| Source Power (W) | 700 | 1000 |
| Bias Power (W) | 250 | 225 |
| Cathode Temp. (° C.) | +50 | +50 |
| Duration | End Pt.<br>+30% | 60 s |

The choice between the three-step process of FIG. 6 and the two-step process of FIG. 7 depends in part on the desired degree of rounding at the shoulder and reproducibility. The two-step process produces more rounding than the three-step recipe, but the three-step recipe produces a more reproducible result.

Other experiments have shown that the relative flows of the two components given by the [CHF$_3$]/[SF$_6$] ratio can be varied between 5 and 15 with satisfactory results, and it is expected that the ratio range can be extended to between 2 and 30.

A 9-point L9-DOE (design of experiment) was run in which the SF$_6$ was varied between 10 and 30 sccm; the pressure between 10 and 50 milliTorr; the source power between 500 and 1200 W; and the bias power between 200 and 350 W while the CHF$_3$ flow was held at 150 sccm and the cathode temperature was held at 50° C. Within this range, nitride etch rates are observed up to between 250 and 300 nm/min and nitride selectivities over photoresist of greater than 1.2. The general trends are that the nitride etch rate is observed to increase with SF$_6$ flow and source and bias power but to decrease with pressure. Below about 800 W of source power and about 250 W of bias power, the nitride etch rate dipped below 200 nm/min. It is believed that the ratio of bias to source power should be kept between 20 and 40%. The nitride etch uniformity depends strongly only upon the SF$_6$ flow, indicating a maximum flow, assuming the remaining parameters, of about 20 sccm. The selectivity of etching nitride over photoresist decreases with SF$_6$ flow and increases with pressure. Even though the nitride etch rate decreases with pressure, microtrenching and microloading are eliminated at higher pressures.

However, it must be noted that the process windows depend upon all the parameters of the baseline recipe. Successful tests have been run with 60 sccm of SF$_6$, 120 sccm of CHF$_3$ at 80 mTorr, 700 to 1000 W of source power, and 150 to 300 W of bias power. Reasonable ranges are 1 to 100 sccm of SF$_6$, 10 to 200 sccm of CHF$_3$, pressures of between 25 and 40 milliTorr, source powers between 300 and 1800 W, bias powers between 50 and 400 W, and cathode temperatures between −20 and +80° C.

Fluorine-based non-carbon gases other than SF$_6$ are known for etching nitride, for example NF$_3$, but SF$_6$ is preferred. Fluorocarbon etching gases tend to produce a flat etching front and thus not produce the desired shoulder.

The polymerization produced by CHF$_3$ can be enhanced by substituting richer hydrofluorocarbons, for example, difluoromethane (CH$_2$F$_2$). However, it is preferred to maintain a clean etching chamber, and the difluoromethane recipe must be closely controlled to prevent excessive polymerization. A more heavily polymerizing gas would likely also coat the chamber walls, necessitating frequent chamber cleaning to avoid process drift and particulate contamination. An experiment has been run to additionally include CF$_4$ in the nitride open recipe. The addition somewhat increases the nitride etch rate but sacrifices some selectivity. Thus, trifluoromethane is the preferred fluoromethane. However, higher-order hydrofluorocarbons may be found having characteristics similar to trifluoromethane.

Figure 1:
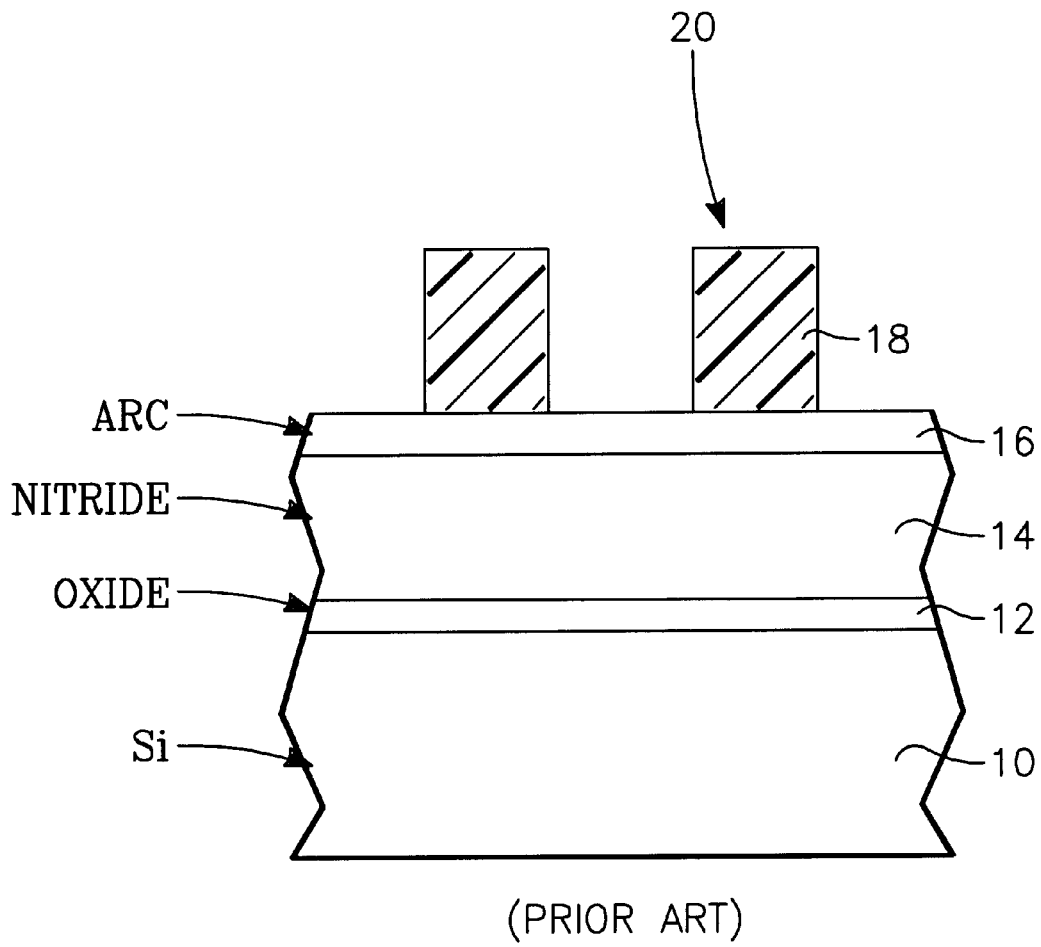
FIG. 1 is a cross-sectional view of a laterally undefined vertical structure used in forming a shallow trench isolation.
Figure 2:
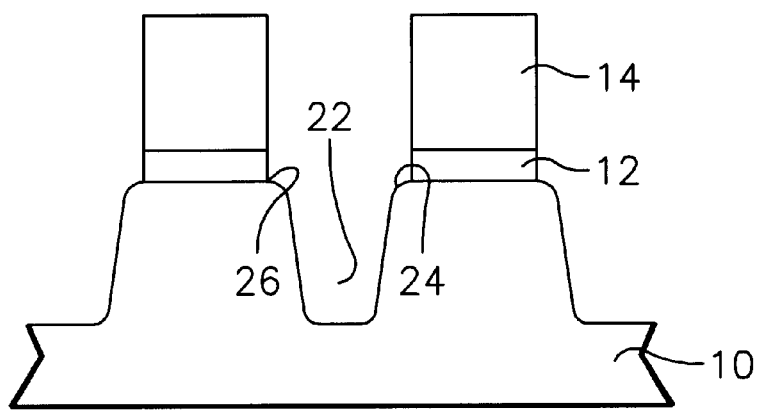
FIG. 2 is a cross-sectional view of the structure of FIG. 1 after trench etching and before oxide filling of the trench for shallow trench isolation.
Figure 3:
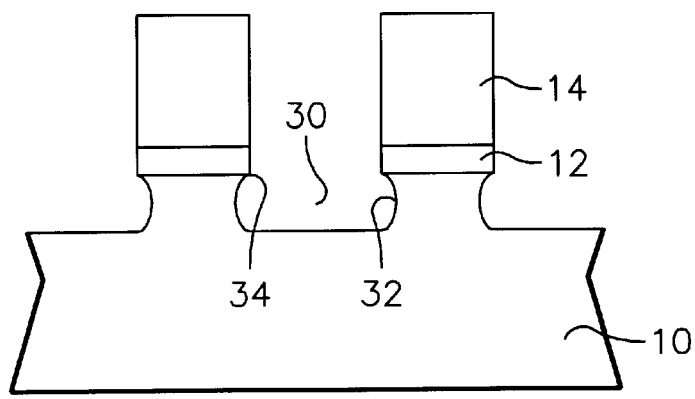
FIGS. 3 and 4 are cross-sectional views of the silicon profile produced at breakthrough of the nitride open step in two prior-art processes.
Figure 4:
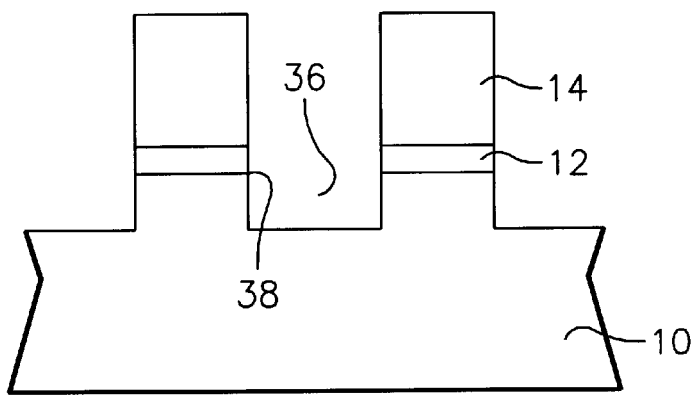

Either nitrogen (N$_2$) or oxygen (O$_2$) may be added to the nitride etch recipe. Nitrogen provides additional sidewall passivation without increasing the polymer contamination problem. Oxygen is used to control CD, that is, the profile of the nitride etch. In some situations, it is desired to have some sidewall etching since the CD of the structure of FIG. 2 is the width of the silicon between the trenches. Also, the addition of 3 to 5 sccm of oxygen has been shown to reduce defect cones which develop beneath defects formed during silicon etching. Accordingly, the photoresist may be patterned with a minimum feature of, for example, 0.21 µm, and a limited amount of outward taper or sidewall etching, perhaps in the amount 0.03 µm, reduces the effective feature size to below 0.18 µm, which would be difficult to achieve by photolithography alone.

Other possible gas additives are possible, but similar results should be obtained if the flows of the SF$_6$ and CHF$_3$ components sum to at least 50% and preferably at least 75% of the total gas flow.

Although the invention has been described with respect to structures requiring a shallow trench isolation, the profile control of the invention may be used in other structures.

Although the invention as described has been practiced on an inductively coupled DPS etch reactor, the invention may be practiced on other plasma reactors including those without inductively coupled plasma source regions, for example, a magnetically enhanced reactive ion etch (MERIE) reactor or other capacitively coupled reactors.

The invention thus provides control of the etching profile with the use in commercially available plasma reactors of commonly used and readily available etching gases.

What is claimed is:

1. A process performed in an etching chamber having a biasable pedestal for supporting a substrate for etching a structure formed in said substrate and including a nitride layer formed over a silicon layer, comprising:

a first step of flowing into a plasma reaction chamber an etching gas mixture comprising a non-carbon fluorine-containing gas and a hydrofluoromcthane consisting of one or more of trifluoromethane and difluoromethane;

exciting said etching gas mixture into a plasma; and

RF biasing said pedestal with a finite but sufficiently low power that said plasma of said etching gas mixture etches said nitride layer with a curved etching front.

2. The process of claim 1, wherein said hydrofluoromethane is trifluoromethane.

3. The process of claim 1, wherein said non-carbon fluorine-containing gas is sulfur hexafluoride.

4. The process of claim 3, wherein said hydrofluoromethane is trifluoromethane.

5. The process of claim 4, further comprising a subsequent second step of flowing into said plasma reaction chamber a silicon etching gas comprising hydrogen bromide and exciting said silicon etching gas into a plasma to etch said silicon layer.

6. The process of claim 4, wherein a ratio of trifluoromethane to sulfur hexafluoride in said etching gas mixture is between 5 and 15.

7. The process of claim 4, wherein said etching gas mixture consists essentially of sulfur hexafluoride, trifluoromethane, and at least one gas selected from the group consisting of nitrogen and oxygen.

8. The process of claim 4, wherein said etching gas mixture consists essentially of sulfur hexafluoride and trifluoromethane.

9. The process of claim 4, wherein said flowing step flows between 1 and 100 sccm of sulfur hexafluoride, and between 10 and 200 sccm of trifluoromethane.

10. The process of claim 1, wherein said biasable pedestal is biased with between 50 to 400W of RF bias power normalized to a 200 mm-diameter circular substrate.

11. The process of claim 10, wherein said etching gas mixture is excited into a plasma by coupling RF power of between 300 and 1800W to an inductive coil operatively associated with said plasma reaction chamber.

12. The process of claim 11, further comprising maintaining a pressure within said flowing step of between 25 and 40 milliTorr.

13. The process of claim 12, wherein said etching gas mixture comprises sulfur hexafluoride and trifluoromethane.

14. The process of claim 1, wherein said non-carbon fluorine-containing gas comprises a fluorine-containing compound.

15. The process of claim 1, wherein said non-carbon fluorine-containing gas comprises nitrogen trifluoride.

16. The process of claim 1, wherein said etching gas mixture consists essentially of said non-carbon fluorine-containing gas and said hydrofluoromethane.

17. A process for etching a structure including a nitride layer formed over a silicon layer and an oxide layer intermediate said nitride and silicon layers, comprising:

a first step of flowing into a plasma reaction chamber an etching gas mixture comprising a non-carbon fluorine-containing gas and a hydrofluoromethane consisting of one or more of trifluoromethane and difluoromethane and including substantially no hydrozen bromide and exciting said etching gas mixture into a plasma, wherein said first step etches said nitride layer and through said oxide layer and etches part of said silicon layer, wherein said first step etches said silicon layer to have a surface sloping away-from a bottom of said oxide layer.

18. The process of claim 1, further comprising a subsequent second step of flowing into said plasma reaction chamber a silicon etching gas comprising hydrogen bromide and exciting said silicon etching gas into a plasma to etch said silicon.

19. The process of claim 4, wherein said structure includes an oxide layer intermediate said nitride and silicon layers and wherein said process further comprises a second step performed after said first step of flowing an oxide etching gas comprising a fluorocarbon into said reaction chamber to etch through said oxide layer and to etch part of said silicon layer.

20. The process of claim 19, wherein said second step etches said silicon layer to have a surface sloping away a bottom of said oxide layer.

21. The process of claim 19, further comprising a third step of flowing into said plasma reaction chamber a silicon etching gas comprising hydrogen bromide and exciting said silicon etching gas into a plasma to etch said silicon.

22. A process of etching a structure of a nitride layer overlying an oxide layer of lesser thickness overlying a silicon layer formed in a substrate, said nitride layer being masked by a photoresist layer with at least one aperture therethrough, said process being performed in a single plasma reaction chamber having a pedestal electrode biased by an RE power source, said process comprising the steps of:

a first step of flowing into said chamber a first gas mixture consisting of comprising sulfur hexafluoride and trifluoromethane but not including an operative amount of a diluent gas and exciting said first gas mixture into a plasma while RE biasing said pedestal electrode to a first power level to thereby etch said nitride layer;

a second step of flowing into said chamber a second gas mixture comprising a fluorocarbon and a diluent gas and exciting said second gas mixture into a plasma while RE biasing said pedestal electrode to a second power level to thereby etch said oxide layer; and a third step of flowing into said chamber a third gas mixture comprising hydrogen bromide and exciting said third gas mixture into a plasma while RE biasing said pedestal electrode to a third power level to thereby etch said silicon layer.

23. The process of claim 22, wherein during said first step a ratio an amount of said trifluorornethane hydrefluorocarben to an amount of said sulfur hexafluoride is greater than one.

24. The process of claim 23, wherein said ratio is between 2 and 30.

25. The process of claim 24, wherein said ratio is between 5 and 15.

26. The process of claim 22, wherein wherein said first- and second step causes a top portion of said silicon layer to be etched with a surface adjacent said oxide layer sloping downwardly at an angle of less than 90° away from said oxide in a hole defined by said aperture in said photoresist layer.

27. The process of claim 22, wherein said plasma reaction chamber additionally has a decoupled plasma source.

28. The process of claim 27, wherein said second power level is less than said first and third power levels.

29. The process of claim 22, wherein said second power level is less than said first and third power levels.

* * * * *